(12) United States Patent
Suda (10) Patent No.: US 7,846,617 B2
(45) Date of Patent: Dec. 7, 2010

(54) PATTERN FORMING METHOD AND PHASE SHIFT MASK MANUFACTURING METHOD

(75) Inventor: Hideki Suda, Tokyo (JP)

(73) Assignee: Hoya Corporation, Tokyo (JP)

( * ) Notice: Subject to any disclaimer, the term of this patent is extended or adjusted under 35 U.S.C. 154(b) by 351 days.

(21) Appl. No.: 11/702,547

(22) Filed: Feb. 6, 2007

(65) Prior Publication Data

US 2007/0187361 A1 Aug. 16, 2007

(30) Foreign Application Priority Data

Feb. 16, 2006 (JP) ............... 2006-039222

(51) Int. Cl.
*G03F 1/00* (2006.01)
*G03C 5/00* (2006.01)
*H01L 21/00* (2006.01)

(52) U.S. Cl. ............... 430/5; 430/30; 430/311

(58) Field of Classification Search ............ 430/5, 430/30, 311
See application file for complete search history.

(56) References Cited

U.S. PATENT DOCUMENTS

| 6,322,935 B1 * | 11/2001 | Smith ............... 430/5 |
| 2003/0003376 A1 * | 1/2003 | Crell ............... 430/5 |
| 2003/0134206 A1 * | 7/2003 | Dettmann et al. ............... 430/5 |
| 2003/0219654 A1 * | 11/2003 | Ushida et al. ............... 430/5 |
| 2004/0081896 A1 * | 4/2004 | Pierrat ............... 430/5 |
| 2005/0247669 A1 | 11/2005 | Wang et al. |

FOREIGN PATENT DOCUMENTS

| JP | 2710967 B2 | 10/1997 |
| JP | 3650055 B2 | 2/2005 |

OTHER PUBLICATIONS

Korean Office Action corresponding to Korean Patent Application No. 10-2007-0016232 dated Mar. 25, 2010 Complete English translation.

* cited by examiner

*Primary Examiner*—Mark F Huff
*Assistant Examiner*—Jonathan Jelsma
(74) *Attorney, Agent, or Firm*—Sughrue Mion, PLLC (57) ABSTRACT

A light-shielding layer over a transparent substrate is processed into a predetermined pattern by first etching and then a recess is formed in an underlying layer below the light-shielding layer by second etching using at least the light-shielding layer as a mask. Subsequently, a defect inspection of the recess is performed. If, as a result of the inspection, a residue defect is detected at the recess otherwise formed in the underlying layer below the light-shielding layer, defect portion data of a pattern of a region including a residue-defect portion is produced and a repairing resist pattern is formed on the light-shielding layer based on the defect portion data. Then, third etching is applied to the underlying layer below the light-shielding layer using the light-shielding layer and the repairing resist pattern as a mask, thereby repairing the residue-defect portion.

14 Claims, 7 Drawing Sheets

PATTERN FORMING METHOD AND PHASE SHIFT MASK MANUFACTURING METHOD

This application claims priority to prior Japanese patent application JP 2006-39222, the disclosure of which is incorporated herein by reference.

BACKGROUND OF THE INVENTION

This invention relates to a pattern forming method and, in particular, relates to a pattern forming method that processes a coating layer over a substrate into a predetermined pattern by partly removing the coating layer and then forms a recess in an underlying layer below the coating layer at its portion corresponding to at least a portion of a region where the coating layer was removed.

This invention also relates to a method of manufacturing a phase shift mask for use in transferring a fine pattern of an LSI or the like by the use of a projection exposure apparatus and, in particular, relates to a method of repairing a residue defect generated at an underlying layer below a light-shielding layer in the manufacturing process.

Following higher integration and circuit pattern miniaturization in large-scale integrated circuits (LSIs), phase shift masks have been proposed and put to practical use as a super-resolution technique in the photolithography.

There have been proposed various types of phase shift masks, such as Levenson type, edge emphasizing type, auxiliary pattern type, chromeless type, and halftone type. For example, the Levenson type phase shift mask has a light-shielding pattern formed by a metal film such as a chromium film, or the like on a transparent substrate. The Levenson type phase shift mask is configured such that, in the case where light-shielding portions and light-transmitting portions are alternately arranged like a line-and-space pattern, the phases of transmitted lights through the light-transmitting portions adjacent to each other via each light-shielding portion are shifted by 180 degrees. Because of the shift in phase between the transmitted lights through the light-transmitting portions, a reduction in resolution due to interference between diffracted lights can be prevented to thereby achieve an improvement in resolution of the line-and-space pattern.

In such a phase shift mask, an optical path length difference of $[\lambda(2m-1)/2]$ (m is a natural number) is generated between transmitted lights, each having a wavelength $\lambda$, through the light-transmitting portions adjacent to each other via the light-shielding portion, thereby causing the phase difference of 180 degrees between the transmitted lights. In order to generate such an optical path length difference, a difference d between the thicknesses of the transparent substrate at the light-transmitting portions adjacent to each other via the light-shielding portion should satisfy $[d=\lambda(2m-1)/2n]$ where n represents a refractive index of the transparent substrate.

In order to generate the difference between the thicknesses of the transparent substrate at the adjacent light-transmitting portions in the phase shift mask, a transparent thin film is coated on the transparent substrate at one of the light-transmitting portions to thereby increase the thickness or the transparent substrate is etched at one of the light-transmitting portions to thereby reduce the thickness. That is, in the shifter coated type (convex type) phase shift mask, the transparent substrate is covered with the transparent thin film (shifter) having the thickness $d$ $(=\lambda(2m-1)/2n)$ at the phase shift portion.

On the other hand, in the etching type phase shift mask in which the transparent substrate is etched, the transparent substrate is etched by the depth $d$ $(=\lambda(2m-1)/2n)$ at the phase shift portion. The light-transmitting portion not coated with the transparent thin film or etched serves as a non-phase-shift portion. Note that in the case where the adjacent light-transmitting portions have a shallow etched portion and a deep etched portion, respectively, the shallow etched portion serves as a non-phase-shift portion.

Further, as a phase shift mask for forming an isolated pattern such as contact holes, the auxiliary pattern type phase shift mask has been proposed as described in Japanese Patent (JP-B) No. 2710967 (Patent Document 1).

Figure 1A:
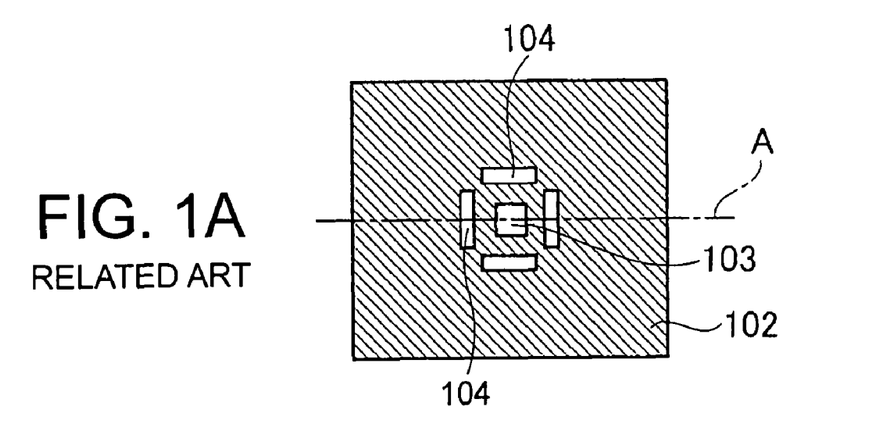
FIG. 1A is a plan view of the auxiliary pattern type phase shift mask (the plan view is the same for both masks) and FIGS. 1B and 1C respectively show sections, each taken along a chain line A in FIG. 1A, in terms of two examples.
Figure 1B:
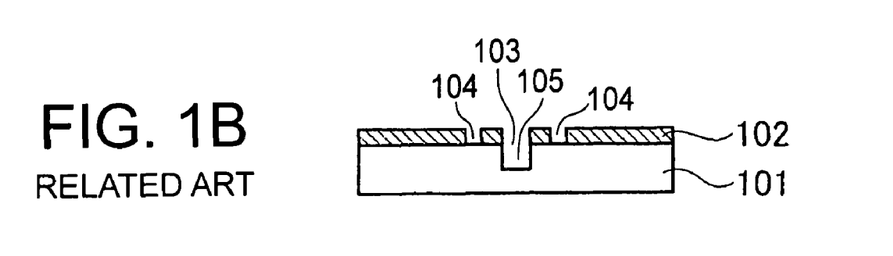
Figure 1C:
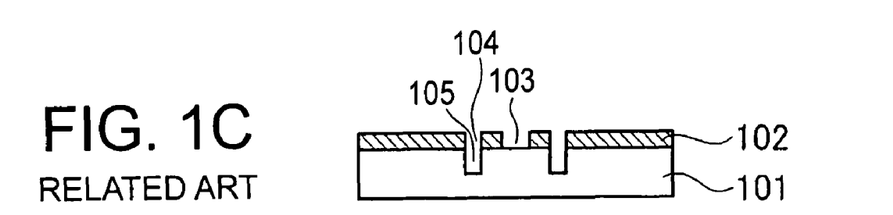

FIGS. 1A to 1C show the structures of auxiliary pattern type phase shift masks, wherein FIG. 1A is a plan view of the auxiliary pattern type phase shift mask (the plan view is the same for both masks) and FIGS. 1B and 1C respectively show sections, each taken along a chain line A in FIG. 1A, in terms of two examples.

In FIGS. 1A to 1C, each auxiliary pattern type phase shift mask comprises a transparent substrate 101 and a light-shielding layer 102 formed thereon, wherein the light-shielding layer 102 is formed with a main opening portion 103 and a plurality of auxiliary opening portions 104 located at peripheral portions of the main opening portion 103. It is configured such that light having passed through the main opening portion 103 and light having passed through each auxiliary opening portion 104 have a phase difference of approximately 180 degrees. For this purpose, in the example shown in FIG. 1B, the transparent substrate 101 has an etched portion 105 etched to a predetermined depth in a region corresponding to the main opening portion 103. On the other hand, in the example shown in FIG. 1C, the transparent substrate 101 has etched portions 105, each etched to a predetermined depth, in regions corresponding to the auxiliary opening portions 104, respectively. The auxiliary opening portions 104 are formed at predetermined positions and each have a fine line width so that the light having passed through each auxiliary opening portion 104 does not resolve a resist on a substrate to which a pattern is transferred.

FIGS. 2A to 2F are process diagrams showing a conventional phase shift mask manufacturing method.

Figure 2A:
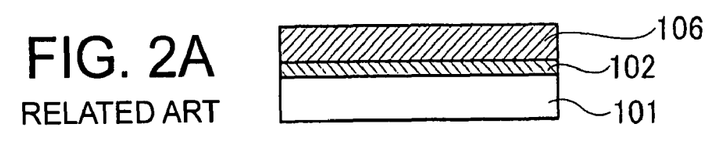
FIGS. 2A to 2F are process diagrams showing a conventional phase shift mask manufacturing method.
Figure 2B:
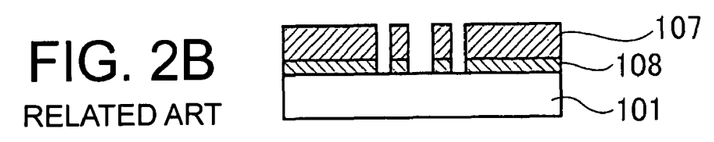
Figure 2C:
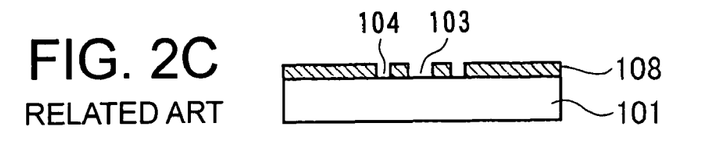

For manufacturing an auxiliary pattern type phase shift mask like that shown in FIG. 1C, a light-shielding layer 102 and a first resist film 106 are first formed on a transparent substrate 101 in the order named as shown in FIG. 2A. Then, as shown in FIG. 2B, the first resist film 106 is written with a pattern corresponding to a main opening portion 103 and a plurality of auxiliary opening portions 104 by the use of, for example, an electron-beam writing apparatus and then developed, thereby forming a first resist pattern 107. Then, the light-shielding layer 102 is etched using the first resist pattern 107 as a mask, thereby forming a light-shielding layer pattern 108 having the main opening portion 103 and the auxiliary opening portions 104. Thereafter, as shown in FIG. 2C, the remaining first resist pattern 107 is stripped.

Figure 2D:
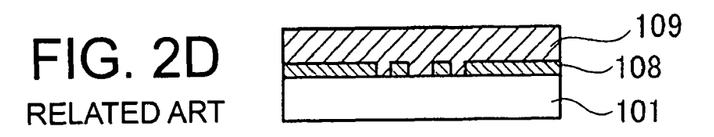
Figure 2E:
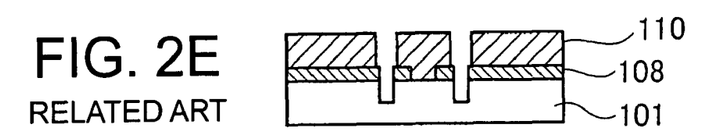
Figure 2F:
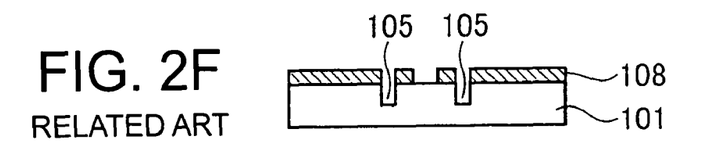

Then, as shown in FIG. 2D, a second resist film 109 is formed on the light-shielding layer pattern 108. Subsequently, as shown in FIG. 2E, the second resist film 109 is written with a pattern corresponding to the auxiliary opening portions 104 by the use of, for example, the electron-beam writing apparatus and then developed, thereby forming a second resist pattern 110. Then, the transparent substrate 101 is etched using the second resist pattern 110 as a mask, thereby forming etched portions 105. Thereafter, as shown in FIG. 2F, the remaining second resist pattern 110 is stripped, thereby completing an auxiliary pattern type phase shift mask.

In the manufacturing method shown in FIGS. 2A to 2F, the transparent substrate 101 is etched in regions corresponding to the auxiliary opening portions 104. However, the same manufacturing method is also applied to the case where the transparent substrate 101 is etched in a region corresponding to the main opening portion 103. That is, in FIG. 2E, the second resist film 109 is written with a pattern corresponding to the main opening portion 103 and then developed, thereby forming a second resist pattern. Subsequently, the transparent substrate 101 is etched using this second resist pattern as a mask, thereby forming an etched portion 105 like that shown in FIG. 1B.

Further, as a phase shift mask for forming an isolated pattern such as contact holes, there is a halftone type phase shift mask.

FIGS. 3A to 3G are process diagrams showing a conventional halftone type phase shift mask manufacturing method.

Figure 3A:
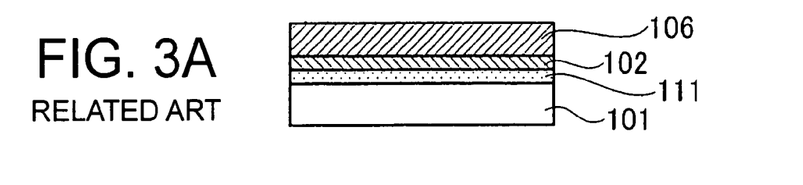
FIGS. 3A to 3G are process diagrams showing a conventional halftone type phase shift mask manufacturing method.
Figure 3B:
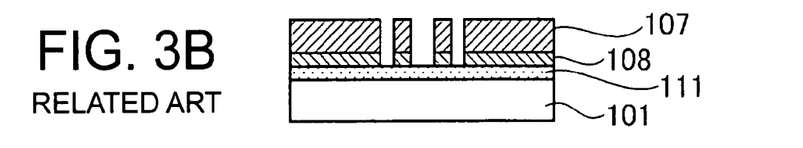
Figure 3C:
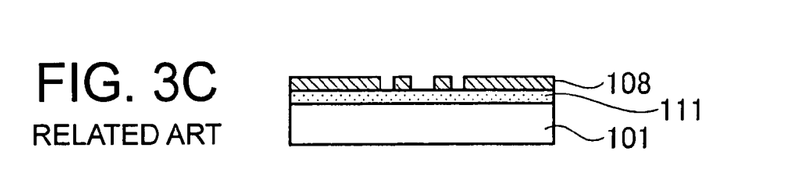

For manufacturing a halftone type phase shift mask, a light-semitransmitting layer 111, a light-shielding layer 102, and a first resist film 106 are first formed on a transparent substrate 101 in the order named as shown in FIG. 3A. Then, as shown in FIG. 3B, the first resist film 106 is written with a hole opening pattern by the use of, for example, an electron-beam writing apparatus and then developed, thereby forming a first resist pattern 107. Then, the light-shielding layer 102 is etched using the first resist pattern 107 as a mask, thereby forming a light-shielding layer pattern 108. Thereafter, as shown in FIG. 3C, the remaining first resist pattern 107 is stripped.

Figure 3D:
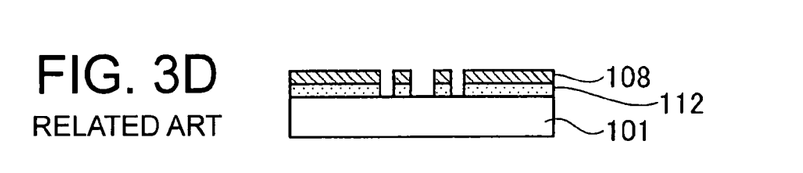
Figure 3E:
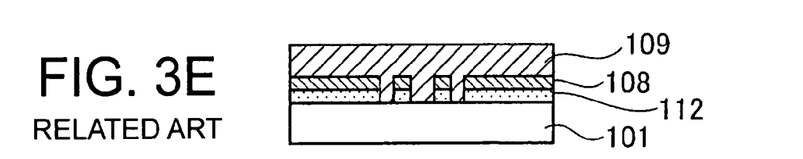
Figure 3F:
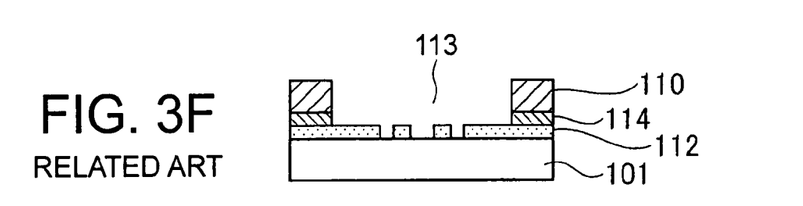
Figure 3G:
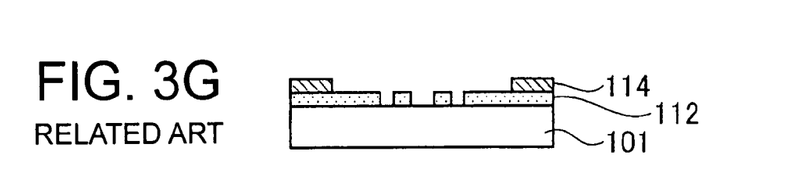

Then, as shown in FIG. 3D, the light-semitransmitting layer 111 is etched using the light-shielding layer pattern 108 as a mask, thereby forming a light-semitransmitting layer pattern 112. Further, as shown in FIG. 3E, a second resist film 109 is formed on the light-shielding layer pattern 108. Then, as shown in FIG. 3F, the second resist film 109 is written with a pattern corresponding to a main opening portion 113 by the use of, for example, the electron-beam writing apparatus and then developed, thereby forming a second resist pattern 110. Then, the light-shielding layer 102 is etched using the second resist pattern 110 as a mask, thereby forming a light-shielding layer pattern 114. Thereafter, as shown in FIG. 3G, the remaining second resist pattern 110 is stripped, thereby completing a halftone type phase shift mask.

Note that, in this case, the light-semitransmitting layer 111 and the light-shielding layer 102 are respectively made of materials each having resistance to the etching of the other material.

In either of the foregoing phase shift mask manufacturing methods, the etching is performed a plurality of times for manufacturing a single phase shift mask. Therefore, as compared with the manufacture of a normal photomask that requires only one-time etching of a light-shielding layer, the phase shift mask manufacturing method is complicated in fabrication process and takes much time, resulting in higher defect generation probability.

In the manufacture of a phase shift mask as described above, a residue defect may be generated due to the incorporation of dust or the like at the time of etching. The residue defect is a defect in which a portion that should be etched is not etched. For repairing such a residue defect, there is applied a method of etching a residue-defect portion by the use of laser light or FIB (Focused Ion Beam), a method of shaving off a residue-defect portion by the use of a superfine needle, or the like.

With respect to a defect generated in the second etching of the light-shielding layer 102 in the halftone type phase shift mask, the global repair is enabled as described in Japanese Patent (JP-B) No. 3650055 (Patent Document 2).

In the meantime, with respect to a defect generated in the manufacture of a phase shift mask as described above, chances of repairing thereof depend on its generation process or its type. That is, in either of the foregoing manufacturing methods, for example, if a defect generated in the first etching of the light-shielding layer 102 is huge or very small or if it is generated at a plurality of portions or has a complicated shape, it is difficult to ensure accuracy of repairing thereof and the time required for the reparing is quite long according to the foregoing various repairing methods. In view of this, it should be judged that it is practically impossible to repair the defect generated in the first etching of the light-shielding layer 102.

On the other hand, it is possible to repair a defect generated in the etching of the transparent substrate 101 or the light-semitransmitting layer 111 after the first etching of the light-shielding layer 102. However, there is also a problem in repairing accuracy and repairing time according to the foregoing various repairing methods and, therefore, there is required a manufacturing method that enables accurate repairing more easily.

Incidentally, the repairing method described in Patent Document 2 is intended for the defect generated in the second etching of the light-shielding layer 102 in the halftone type phase shift mask and cannot deal with the defect generated in the etching of the transparent substrate 101 or the defect generated in the etching of the light-semitransmitting layer 111.

SUMMARY OF THE INVENTION

It is an object of this invention to provide a phase shift mask manufacturing method that can easily and accurately repair a residue defect generated in etching of a transparent substrate or a light-semitransmitting layer after first etching of a light-shielding layer.

It is another object of this invention to provide a pattern forming method adapted to form a recess in an underlying layer below a coating layer over a substrate, wherein the pattern forming method can easily and accurately repair a residue defect generated in etching of the underlying layer below the coating layer which is performed after first etching of the coating layer.

(First Aspect)

According to a first aspect of this invention, a pattern forming method comprises the steps of forming a resist pattern on a coating layer on a substrate, applying a first etching to the coating layer using the resist pattern as a mask to form a pattern on the coating layer, and applying a second etching to an underlying layer which lies below the coating layer using at least the coating layer as a mask to form a recess in the underlying layer. The pattern forming method further comprises performing a defect inspection for the recess, producing defect portion data of a pattern including a residue-defect portion when a residue defect of the recess is detected by the defect inspection. The pattern forming method still further comprises forming a repairing resist pattern on the coating layer based on the defect portion data and applying a third etching to the underlying layer using the coating layer and the repairing resist pattern as a mask to form the recess in the underlying layer, thereby repairing the residue-defect portion.

(Second Aspect)

In the pattern forming method according to the first aspect, it is preferable that the underlying layer is the substrate.

(Third Aspect)

In the pattern forming method according to the first aspect, the underlying layer may be a second coating layer formed between the coating layer and the substrate.

(Fourth Aspect)

In the pattern forming method according to any one of the first to third aspects, the defect portion data is produced in a manner that the defect portion data contain a pattern data representing a recess of a size which is larger than the size for the recess to be formed in the underlying layer, based on a coordinate data of the residue-defect.

(Fifth Aspect)

According to a fifth aspect of this invention, a method for manufacturing a phase shift mask comprising a light-shielding layer over a transparent substrate comprises the steps of forming a resist pattern on the light-shielding layer, applying a first etching to the light-shielding layer using the resist pattern as a mask to form a pattern on the light-shielding layer, and applying a second etching to an underlying layer which lies below the light-shielding layer using at least the light-shielding layer as a mask to form a recess in the underlying layer. The method further comprises performing a defect inspection for the recess, producing defect portion data of a pattern including a residue-defect portion when a residue defect of the recess is detected by the defect inspection, forming a repairing resist pattern on the light-shielding layer based on the defect portion data, and applying a third etching to the underlying layer using the light-shielding layer and the repairing resist pattern as a mask to form the recess in the underlying layer, thereby repairing the residue-defect portion.

(Sixth Aspect)

In the phase shift mask manufacturing method according to the fifth aspect, it is preferable that the underlying layer is the transparent substrate.

(Seventh Aspect)

In the phase shift mask manufacturing method according to the fifth aspect, the underlying layer may be a light-semitransmitting layer formed between the light-shielding layer and the transparent substrate.

(Eighth Aspect)

In the phase shift mask manufacturing method according to any one of the fifth to seventh aspects, the defect portion data is produced in a manner that the defect portion data contain a pattern data representing a recess of a size which is larger than the size for the recess to be formed in said underlying layer, based on a coordinate data of the residue-defect.

In this invention, a defect inspection of a recess is performed after forming the recess in an underlying layer below a coating layer or a light-shielding layer and, when a residue defect is detected, defect portion data representing a residue-defect portion is produced, thereby repairing the residue-defect portion by third etching based on the defect portion data. Therefore, only by adding the relatively easy process to a conventional manufacturing method, it is possible to accurately repair the residue-defect portion, thereby improving the yield.

That is, according to this invention, it is possible to provide a phase shift mask manufacturing method that can easily and accurately repair a residue defect generated in etching of a transparent substrate or a light-semitransmitting layer after first etching of a light-shielding layer.

Further, according to this invention, it is possible to provide a pattern forming method adapted to form a recess in an underlying layer below the coating layer, wherein the pattern forming method can easily and accurately repair a residue defect generated in etching of the underlying layer below the coating layer which is performed after first etching of the coating layer.

BRIEF DESCRIPTION OF THE DRAWINGS

FIGS. 1A to 1C show the general structures of auxiliary pattern type phase shift masks, wherein

FIGS. 4A to 4J are process diagrams showing a first embodiment of a phase shift mask manufacturing method according to this invention (in the case of an auxiliary pattern type phase shift mask);

DESCRIPTION OF THE PREFERRED EMBODIMENTS

Referring now to the drawings, a description will hereinbelow be given in detail of embodiments of pattern forming methods according to this invention. In each of the following embodiments, the pattern forming method according to this invention is applied to a phase shift mask manufacturing method. However, this invention is not limited to the phase shift mask manufacturing method. That is, in the following description, a transparent substrate can be any one of various substrates including those that are not transparent and a light-shielding layer can be any one of various coating layers.

First Embodiment

FIGS. 4A to 4J are process diagrams showing a first embodiment of a phase shift mask manufacturing method according to this invention (in the case of an auxiliary pattern type phase shift mask).

Figure 4A:
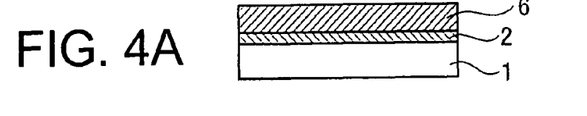
Figure 4B:
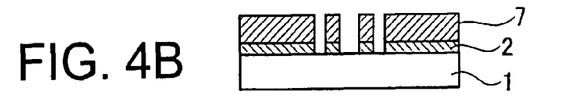
Figure 4C:
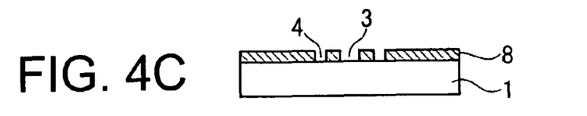

In the phase shift mask manufacturing method according to the first embodiment, in order to manufacture an auxiliary pattern type phase shift mask, a light-shielding layer (or a coating layer) 2 and a first resist film 6 are first formed on a transparent substrate 1 in the order named as shown in FIG. 4A. In this case, an underlying layer below the light-shielding layer 2 is the transparent substrate 1. Then, as shown in FIG. 4B, the first resist film 6 is written with a pattern corresponding to a main opening portion 3 (FIG. 4C) and auxiliary opening portions 4 (FIG. 4C) by the use of, for example, an electron-beam writing apparatus and then developed, thereby forming a first resist pattern 7. Then, the light-shielding layer 2 is etched using the first resist pattern 7 as a mask, thereby forming a light-shielding layer pattern 8 having the main opening portion 3 and the auxiliary opening portions 4 (FIG. 4C). Thereafter, as shown in FIG. 4C, the remaining first resist pattern 7 is stripped.

Figure 4D:
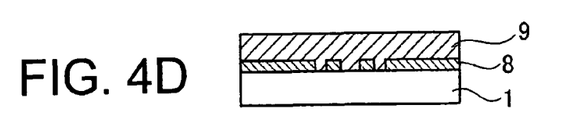
Figure 4E:
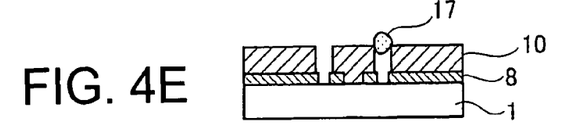
Figure 4F:
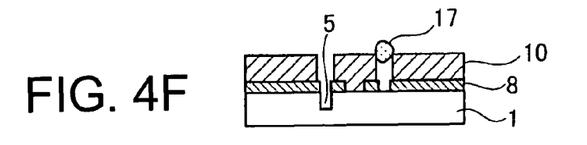

Then, as shown in FIG. 4D, a second resist film 9 is formed on the light-shielding layer pattern 8. Subsequently, as shown in FIG. 4E, the second resist film 9 is written with a pattern corresponding to the auxiliary opening portions 4 by the use of, for example, the electron-beam writing apparatus and then developed, thereby forming a second resist pattern 10. Then, the transparent substrate 1 is etched using the light-shielding layer pattern 8 and the second resist pattern 10 as a mask, thereby forming etched portions (recesses) 5. Herein, it is assumed, for example, that a foreign substance 17 enters a portion corresponding to one of the auxiliary opening portions 4 after the formation of the second resist pattern 10 as shown in FIG. 4E. Then, as shown in FIG. 4F, the etching of the transparent substrate 1 is impeded at the portion where the foreign substance 17 is present and thus a residue defect (non-etching defect) 18 (FIG. 4G) is generated.

Thereafter, as shown in FIG. 4G, the remaining second resist pattern 10 is stripped. Then, a defect inspection is performed with respect to the etching state of the transparent substrate 1.

Figure 5A:
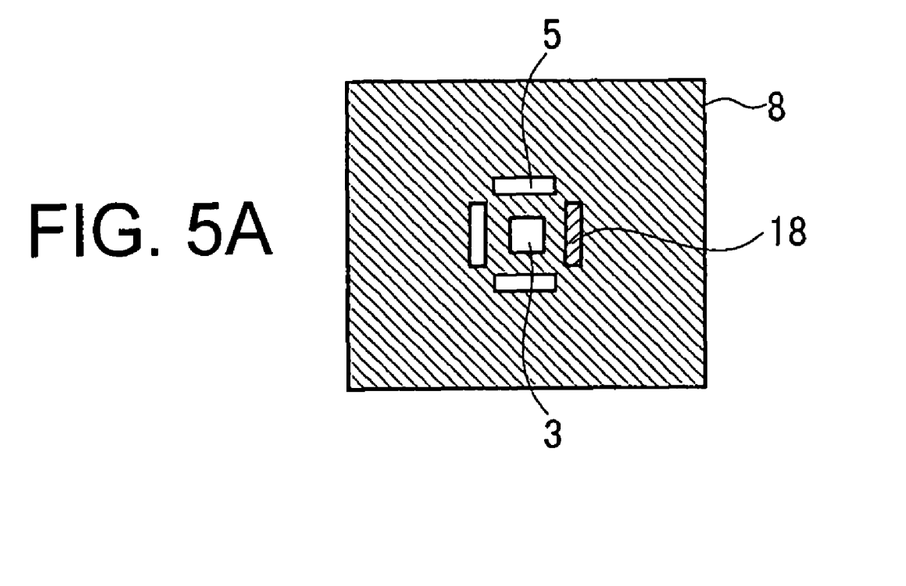
FIG. 5A is a plan view showing the state of a residue defect detected by a defect inspection in the first embodiment of the phase shift mask manufacturing method according to this invention and FIG. 5B is a plan view showing defect portion data of a pattern of a region including a residue-defect portion.
Figure 5B:
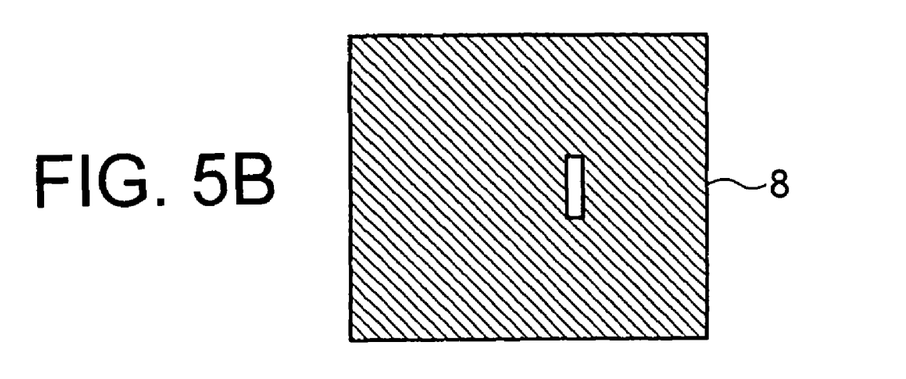

FIG. 5A is a plan view showing the state of a residue defect detected by the defect inspection and FIG. 5B is a plan view showing defect portion data of a pattern of a region including a residue-defect portion.

In the defect inspection, when, as shown in FIG. 5A, the residue defect 18 is detected at an otherwise etched portion 5 to be formed in the transparent substrate 1, there is produced defect portion data of a pattern of the residue-defect portion or a pattern of a region including the residue-defect portion as shown in FIG. 5B. This defect portion data is produced by extracting coordinate data of the residue-defect portion and using this extracted coordinate data. It is preferable that the defect portion data be produced as data representing a region larger than the otherwise etched portion 5 to be formed in the transparent substrate 1. In other words, it is preferable that the defect portion data is produced in a manner that the defect portion data contain a pattern data representing an etched portion of a size which is larger than the size for the etched portion 5 to be formed in the transparent substrate 1, based on the coordinate data of the residue-defect.

Figure 4H:
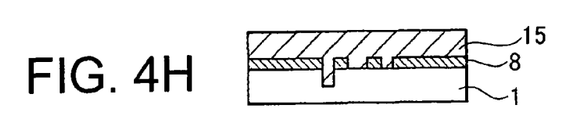
Figure 4I:
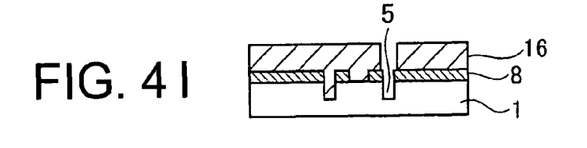

After the defect inspection, a repairing resist film 15 is formed on the light-shielding layer pattern 8 as shown in FIG. 4H. Then, as shown in FIG. 4I, the repairing resist film 15 is written with a pattern using, for example, the electron-beam writing apparatus based on the defect portion data obtained in the defect inspection and then is developed, thereby forming a repairing resist pattern 16. Then, the transparent substrate 1 is etched using the repairing resist pattern 16 as a mask, thereby forming (repairing) an etched portion 5.

Thereafter, as shown in FIG. 4J, the remaining repairing resist pattern 16 is stripped, thereby completing an auxiliary pattern type phase shift mask.

As described above, in the first embodiment, the defect inspection is performed after the second etching and, when a residue defect is found, a residue-defect portion is repaired by producing defect portion data corresponding to the residue-defect portion, coating a repairing resist film, forming a repairing resist pattern by alignment writing again based on the defect portion data, and then carrying out etching by the use of the repairing resist pattern. Therefore, even if a residue-defect portion is huge or very small or has a complicated shape or even if a plurality of residue-defect portions are generated, repairing thereof can be easily enabled.

This invention is based on the assumption that there is formed a light-shielding layer pattern obtained by first etching. Accordingly, in this invention, edges of the light-shielding layer pattern have already been defined and, therefore, by setting defect portion data corresponding to a residue-defect portion to be slightly larger than a normal pattern size, even if some alignment offset occurs in overlay writing, it is possible to avoid the influence otherwise caused by this alignment offset.

In the first embodiment, the light-shielding layer 2 is used as a coating layer. However, a coating layer is not limited to a single layer and, for example, may be comprised of the light-shielding layer 2 and a light-semitransmitting layer formed under it. In this case, it may be configured, for example, such that the light-shielding layer 2 is formed by a film made of a chromium-based material and the light-semitransmitting layer is formed by a film made of a molybdenum silicide based material, thereby removing a part or the whole of the light-shielding layer 2 with the light-semitransmitting layer left remaining after the process shown in FIG. 4J.

Second Embodiment

FIGS. 6A to 6L are process diagrams showing a second embodiment of a phase shift mask manufacturing method according to this invention (in the case of a halftone type phase shift mask).

Figure 6A:
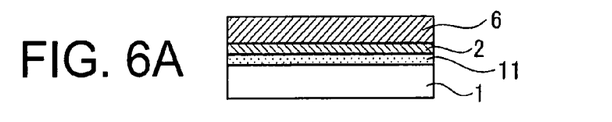
FIGS. 6A to 6L are process diagrams showing a second embodiment of a phase shift mask manufacturing method according to this invention (in the case of a halftone type phase shift mask)
Figure 6B:
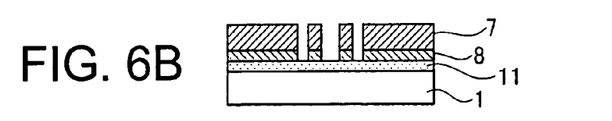
Figure 6C:
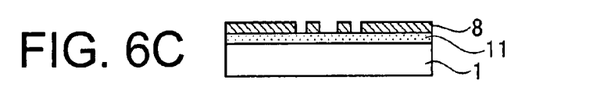

In the phase shift mask manufacturing method according to the second embodiment, in order to manufacture a halftone type phase shift mask, a light-semitransmitting layer (second coating layer) 11, a light-shielding layer 2, and a first resist film 6 are first formed on a transparent substrate 1 in the order named as shown in FIG. 6A. In this case, an underlying layer below the light-shielding layer 2 is the light-semitransmitting layer 11 formed between the light-shielding layer (coating layer) 2 and the transparent substrate 1. Then, as shown in FIG. 6B, the first resist film 6 is written with a hole opening pattern by the use of, for example, an electron-beam writing apparatus and then developed, thereby forming a first resist pattern 7. Then, the light-shielding layer 2 is etched using the first resist pattern 7 as a mask, thereby forming a light-shielding layer pattern 8. Thereafter, as shown in FIG. 6C, the remaining first resist pattern 7 is stripped.

Figure 6D:
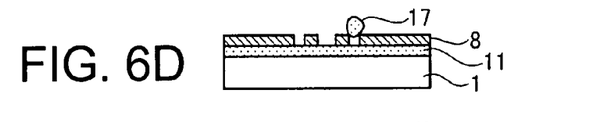
Figure 6E:
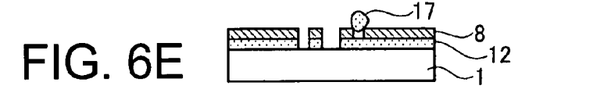
Figure 6F:
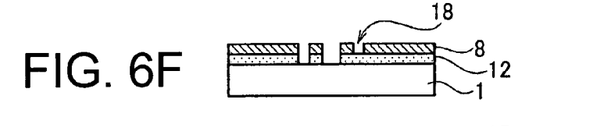

Then, the light-semitransmitting layer 11 is etched using the light-shielding layer pattern 8 as a mask, thereby forming a light-semitransmitting layer pattern 12 (FIG. 6E). Herein, it is assumed that a foreign substance 17 enters one of opening portions of the light-shielding layer pattern 8 as shown in FIG. 6D. Then, as shown in FIG. 6E, the etching of the light-semitransmitting layer 11 is impeded at the portion where the foreign substance 17 is present and, as shown in FIG. 6F, a residue defect (non-etching defect) 18 is generated.

Herein, a defect inspection is performed with respect to the etching state of the light-semitransmitting layer 11.

Figure 7A:
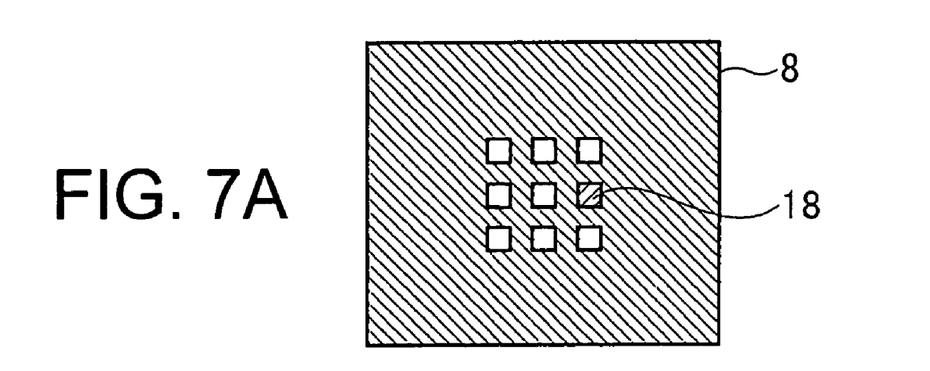
FIG. 7A is a plan view showing the state of a residue defect detected by a defect inspection in the second embodiment of the phase shift mask manufacturing method according to this invention and FIG. 7B is a plan view showing defect portion data of a pattern of a region including a residue-defect portion.
Figure 7B:
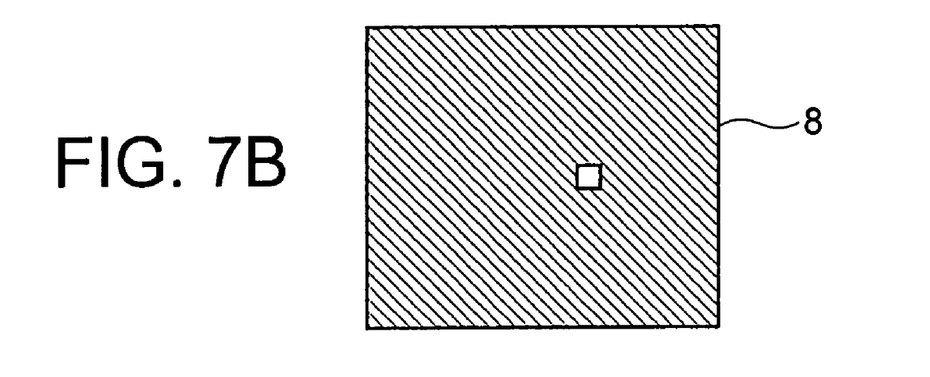

FIG. 7A is a plan view showing the state of a residue defect detected by the defect inspection and FIG. 7B is a plan view showing defect portion data of a pattern of a region including a residue-defect portion.

In the defect inspection, when, as shown in FIG. 7A, the residue defect 18 is detected at an opening portion (recess) to be formed in the light-semitransmitting layer 11, there is produced defect portion data of a pattern of the residue-defect portion or a pattern of a region including the residue-defect portion as shown in FIG. 7B. This defect portion data is produced by extracting coordinate data of the residue-defect portion and using this extracted coordinate data. It is preferable that the defect portion data be produced as data representing a region larger than the opening portion to be formed in the light-semitransmitting layer 11. In other words, it is preferable that the defect portion data is produced in a manner that the defect portion data contain a pattern data representing an opening portion of a size which is larger than the size for the opening portion to be formed in the light-semitransmitting layer 11, based on the coordinate data of the residue-defect.

Figure 6G:
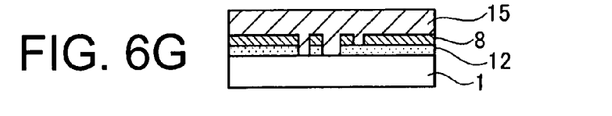
Figure 6H:
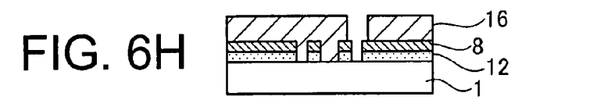
Figure 6I:
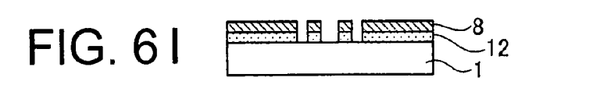

After the defect inspection, a repairing resist film 15 is formed on the light-shielding layer pattern 8 as shown in FIG. 6G. Then, as shown in FIG. 6H, the repairing resist film 15 is written with a pattern using, for example, the electron-beam writing apparatus based on the defect portion data obtained in the defect inspection and then is developed, thereby forming a repairing resist pattern 16. Then, the light-semitransmitting layer 11 is etched using the repairing resist pattern 16 as a mask, thereby forming (repairing) an opening portion. Then, as shown in FIG. 6I, the remaining repairing resist pattern 16 is stripped.

Figure 6J:
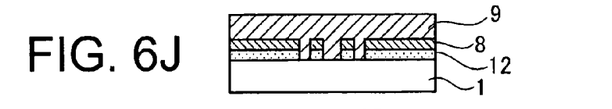
Figure 6K:
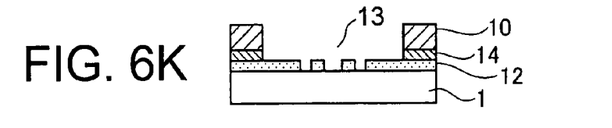
Figure 6L:
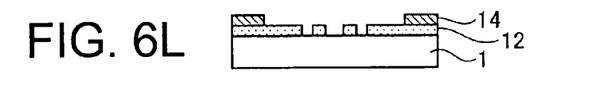

Further, as shown in FIG. 6J, a second resist film 9 is formed on the light-shielding layer pattern 8. Then, as shown in FIG. 6K, the second resist film 9 is written with a pattern corresponding to a main opening portion 13 by the use of, for example, the electron-beam writing apparatus and then developed, thereby forming a second resist pattern 10. Then, the light-shielding layer 2 is etched using the second resist pattern 10 as a mask, thereby forming a light-shielding layer pattern 14. Thereafter, as shown in FIG. 6L, the remaining second resist pattern 10 is stripped, thereby completing a halftone type phase shift mask.

In the second embodiment, when etching the light-semitransmitting layer 11 using the light-shielding layer pattern 8 as a mask and when etching the light-semitransmitting layer 11 (in the form of the light-semitransmitting layer pattern 12) using the repairing resist pattern 16 as a mask, the transparent substrate 1 may also be etched along with the light-semitransmitting layer 11. In this case, the state is such that there are formed recesses each penetrating the light-semitransmitting layer 11 to reach the inside of the transparent substrate 1, i.e. the transparent substrate 1 is formed with etched portions at those portions where opening portions are formed in the light-semitransmitting layer 11.

Also in the second embodiment, the defect inspection is performed after the second etching and, when a residue defect is found, a residue-defect portion is repaired by producing defect portion data corresponding to the residue-defect portion, coating a repairing resist film, forming a repairing resist pattern by alignment writing again based on the defect portion data, and then carrying out etching by the use of the repairing resist pattern. Therefore, even if a residue-defect portion is huge or very small or has a complicated shape or even if a plurality of residue-defect portions are generated, repairing thereof can be easily enabled.

The second embodiment is also based on the assumption that there is formed a light-shielding layer pattern obtained by first etching. Accordingly, also in the second embodiment, edges of the light-shielding layer pattern have already been defined and, therefore, by setting defect portion data corresponding to a residue-defect portion to be slightly larger than a normal pattern size, even if some alignment offset occurs in overlay writing, it is possible to avoid the influence otherwise caused by this alignment offset.

First Example

Hereinbelow, a description will be given of a first example of a phase shift mask manufacturing method according to this invention.

As a transparent substrate, there was prepared a quarts glass substrate having mirror-polished surfaces and subjected to predetermined cleaning. This transparent substrate had a 6-inch square size with a thickness of 0.25 inches. At first, a light-shielding layer made of chromium and having a thickness of 100 nm was formed on the transparent substrate by sputtering. Then, as a first resist film, a positive-type electron-beam resist ("ZEP7000" manufactured by Zeon Corporation) was coated to a thickness of 500 nm on the light-shielding layer by spin coating.

Then, the first resist film was written with a pattern corresponding to a main opening portion and auxiliary opening portions by the use of an electron-beam writing apparatus and then developed, thereby forming a first resist pattern. Then, dry etching using a mixed gas of $Cl_2$ and $O_2$ was applied to the light-shielding layer using the first resist pattern as a mask, thereby forming a light-shielding layer pattern having the main opening portion and the auxiliary opening portions. Thereafter, the remaining first resist pattern was stripped.

Then, as a second resist film, a positive-type electron-beam resist ("ZEP7000" manufactured by Zeon Corporation) was coated to a thickness of 500 nm on the light-shielding layer pattern by spin coating. Subsequently, the second resist film was written with a pattern corresponding to the auxiliary opening portions by the use of the electron-beam writing apparatus and then developed, thereby forming a second resist pattern. Then, dry etching using a mixed gas of $CHF_3$ and $O_2$ was applied to the transparent substrate using the second resist pattern as a mask, thereby forming recesses each having a thickness of 170 nm in the transparent substrate. Thereafter, the remaining second resist pattern was stripped.

Then, a defect inspection was performed. As a result of the inspection, it was found that some foreign substance was considered to adhere to one of the auxiliary opening portions in the second etching, thus resulting in a non-etching residue defect at a corresponding portion. Accordingly, there was produced defect portion data of only a pattern subjected to the non-etching defect.

Subsequently, a repairing resist film was formed on the light-shielding layer pattern. Then, the repairing resist film was written with a pattern corresponding to the residue-defect portion based on the defect portion data by the use of the electron-beam writing apparatus and then was developed, thereby forming a repairing resist pattern. Then, the transparent substrate was etched using the repairing resist pattern as a mask, thereby forming a normal pattern to repair the residue-defect portion.

Thereafter, the remaining repairing resist pattern was stripped, thereby completing an auxiliary pattern type phase shift mask.

The auxiliary pattern type phase shift mask manufactured through the foregoing processes was subjected to a defect inspection again thereafter, but no residue-defect portion was detected, and further, excellent results were obtained also in transfer.

Second Example

A description will be given of a second example of a phase shift mask manufacturing method according to this invention.

As a transparent substrate, there was prepared a quarts glass substrate having mirror-polished surfaces and subjected to predetermined cleaning. This transparent substrate had a 6-inch square size with a thickness of 0.25 inches. At first, a light-semitransmitting layer made of molybdenum silicide nitride and having a thickness of 93 nm was formed on the transparent substrate by sputtering. Then, a light-shielding layer made of chromium and having a thickness of 100 nm was formed on the light-semitransmitting layer by sputtering. Then, as a first resist film, a positive-type electron-beam resist ("ZEP7000" manufactured by Zeon Corporation) was coated to a thickness of 500 nm on the light-shielding layer by spin coating.

Then, the first resist film was written with a pattern corresponding to opening portions by the use of an electron-beam writing apparatus and then developed, thereby forming a first resist pattern. Then, dry etching using a mixed gas of $Cl_2$ and $O_2$ was applied to the light-shielding layer using the first resist pattern as a mask, thereby forming a light-shielding layer pattern having the opening portions. Thereafter, the remaining first resist pattern was stripped.

Then, dry etching using a mixed gas of $CF_4$ and $O_2$ was applied to the light-semitransmitting layer using the light-shielding layer pattern as a mask, thereby forming a light-semitransmitting layer pattern.

Subsequently, a defect inspection was performed. As a result of the inspection, it was found that some foreign substance was considered to adhere to one of the opening portions in the second etching, thus resulting in a non-etching residue defect at a corresponding portion. Accordingly, there was produced defect portion data of only a pattern subjected to the non-etching defect.

Then, a repairing resist film ("ZEP7000" manufactured by Zeon Corporation) was formed on the light-shielding layer pattern. Then, the repairing resist film was written with a pattern corresponding to the residue-defect portion based on the defect portion data by the use of the electron-beam writing apparatus and then was developed, thereby forming a repairing resist pattern. Then, dry etching using a mixed gas of $CF_4$ and $O_2$ was applied to the light-semitransmitting layer using the repairing resist pattern as a mask, thereby forming a normal pattern to repair the residue-defect portion. Thereafter, the remaining repairing resist pattern was stripped.

Then, as a second resist film, a positive-type electron-beam resist ("ZEP7000" manufactured by Zeon Corporation) was coated to a thickness of 500 nm on the light-shielding layer pattern by spin coating. Subsequently, the second resist film was written with a pattern corresponding to a main opening portion by the use of the electron-beam writing apparatus and then developed, thereby forming a second resist pattern. Then, dry etching using a mixed gas of $Cl_2$ and $O_2$ was applied to the light-shielding layer using the second resist pattern as a mask, thereby forming a light-shielding layer pattern. Thereafter, the remaining second resist pattern was stripped, thereby completing a halftone type phase shift mask.

The halftone type phase shift mask manufactured through the foregoing processes was subjected to a defect inspection again thereafter, but no residue-defect portion was detected, and further, excellent results were obtained also in transfer.

While the auxiliary pattern type phase shift mask and the halftone type phase shift mask have been described in detail, this invention is not limited thereto, but is also applicable to various other phase shift masks.

That is, this invention is applicable to a photomask manufacturing method in which a light-shielding layer pattern obtained by first etching is used as a mask in second etching, and so on, and thus is also applicable to a manufacturing method of an alternating type phase shift mask (so-called Levenson type phase shift mask).

This invention is applicable to various photomask manufacturing methods each using a coating layer processed into a predetermined pattern as a mask to etch an underlying layer below the coating layer, thereby forming a recess in the underlying layer below the coating layer. For example, it is applicable to any photomask manufacturing method in which a portion to be selectively etched can be specified by combination of processes and data processing when forming a recess in a transparent substrate. Further, as described before, it may be a photomask manufacturing method in which a light-semitransmitting layer is formed as an underlying layer below a light-shielding layer and the light-shielding layer is finally removed after forming a recess in a transparent substrate. In this case, the light-semitransmitting layer may be a thin film that does not substantially generate a phase difference.

What is claimed is:

1. A pattern forming method comprising the steps of:
   forming a resist pattern on a coating layer on a substrate;
   applying a first etching to said coating layer using said resist pattern as a mask to form a first pattern in said coating layer, an edge of said first pattern being defined by the first etching;
   applying a second etching to an underlying layer which lies below said coating layer using at least said first pattern having said edge as a mask to form a recess pattern in said underlying layer;
   performing a defect inspection for said recess pattern;
   producing, when a residue-defect in said recess pattern is detected by said defect inspection, defect portion data including a residue-defect portion;
   forming a repairing resist pattern on said coating layer based on said defect portion data;
   applying a third etching to said underlying layer using said first pattern having said edge and said repairing resist pattern as a mask to form a recess in said underlying layer, thereby repairing said residue-defect;
   forming a resist pattern for forming an opening on the coating layer; and
   applying a fourth etching, using said resist pattern for forming the opening as a mask, to said coating layer whereby said opening is formed so that said first pattern in said coating layer is removed.

2. A pattern forming method according to claim 1, wherein said underlying layer is said substrate.

3. A pattern forming method according to claim 1, wherein said underlying layer is a second coating layer formed between said coating layer and said substrate.

4. A pattern forming method according to claim 1, wherein said defect portion data is produced in a manner that the defect portion data contain a pattern data representing a recess of a size which is larger than the size for the recess to be formed in said underlying layer, based on a coordinate data of said residue-defect.

5. A pattern forming method according to claim 1, wherein said coating layer and said underlying layer each comprises a material having a resistance to the etching of the other.

6. A pattern forming method according to claim 1, wherein said coating layer is light-shielding layer.

7. A method for manufacturing a phase shift mask comprising the steps of:
   forming a resist pattern on a light-shielding layer which is formed over a transparent substrate;

applying a first etching to said light-shielding layer using said resist pattern as a mask to form a first pattern in said light-shielding layer, an edge of said first pattern being defined by the first etching;

applying a second etching to an underlying layer which lies below said light-shielding layer using at least said first pattern having said edge as a mask to form a recess pattern in said underlying layer;

performing a defect inspection for said recess pattern;

producing, when a residue-defect in said recess pattern is detected by said defect inspection, defect portion data including a residue-defect portion;

forming a repairing resist pattern on said light-shielding layer based on said defect portion data;

applying a third etching to said underlying layer using said first pattern having said edge and said repairing resist pattern as a mask to form a recess in said underlying layer, thereby repairing said residue-defect;

forming a resist pattern for forming an opening on the light-shielding layer; and applying a fourth etching, using said resist pattern for forming the opening as a mask, to said light-shielding layer whereby said opening is formed so that said first pattern in said light-shielding layer is removed.

8. A phase shift mask manufacturing method according to claim 7, wherein said underlying layer is said transparent substrate.

9. A phase shift mask manufacturing method according to claim 7, wherein said underlying layer is a light-semitransmitting layer formed between said light-shielding layer and said transparent substrate.

10. A phase shift mask manufacturing method according to claim 7, wherein said defect portion data is produced in a manner that the defect portion data contain a pattern data representing a recess of a size which is larger than the size for the recess to be formed in said underlying layer, based on a coordinate data of said residue-defect.

11. A phase shift mask manufacturing method according to claim 7, wherein said light-shielding layer and said underlying layer each comprises a material having a resistance to the etching of the other.

12. A phase shift mask manufacturing method comprising the steps of:

forming a resist pattern on a coating layer formed over a transparent substrate;

applying a first etching to said coating layer using said resist pattern as a mask to form a first pattern in said coating layer, an edge of said first pattern being defined by the first etching;

applying a second etching to an underlying layer which lies below said coating layer using at least said first pattern having said edge as a mask to form a recess pattern in said underlying layer;

performing a defect inspection for said recess pattern;

producing, when a residue-defect in said recess pattern is detected by said defect inspection, defect portion data including a residue-defect portion;

forming a repairing resist pattern on said coating layer based on said defect portion data;

applying a third etching to said underlying layer using said first pattern having said edge and said repairing resist pattern as a mask to form a recess in said underlying layer, thereby repairing said residue-defect;

forming a resist pattern for forming an opening on the coating layer; and applying a fourth etching, using said resist pattern for forming the opening as a mask, to said coating layer whereby said opening is formed so that said first pattern in said coating layer is removed.

13. A phase shift mask manufacturing method according to claim 12, wherein said coating layer and said underlying layer each comprises a material having a resistance to the etching of the other.

14. A phase shift mask manufacturing method according to claim 12, wherein said coating layer is light-shielding layer.

* * * * *